US012765432B2

(12) United States Patent
Suk et al.

(10) Patent No.: US 12,765,432 B2
(45) Date of Patent: Oct. 13, 2026

(54) SEMICONDUCTOR PACKAGE AND METHOD FOR MANUFACTURING THE SAME

(71) Applicant: Samsung Electronics Co., Ltd., Suwon-si (KR)

(72) Inventors: Kyoung Lim Suk, Suwon-si (KR); Kyung Don Mun, Suwon-si (KR); Inhyung Song, Suwon-si (KR); Yeonho Jang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 359 days.

(21) Appl. No.: 18/623,645

(22) Filed: Apr. 1, 2024

(65) Prior Publication Data

US 2025/0062208 A1 Feb. 20, 2025

(30) Foreign Application Priority Data

Aug. 16, 2023 (KR) ........................ 10-2023-0107048

(51) Int. Cl.
*H10W 90/00* (2026.01)
*H10W 74/10* (2026.01)

(52) U.S. Cl.
CPC ........ *H10W 90/401* (2026.01); *H10W 74/117* (2026.01); *H10W 90/00* (2026.01); *H10W 90/724* (2026.01)

(58) Field of Classification Search
CPC . H10W 90/401; H10W 74/117; H10W 90/00; H10W 90/724; H10W 70/611; H10W 70/614; H10W 70/685; H10W 90/701; H10W 72/20; H10P 72/7424; H10P 72/74
See application file for complete search history.

(56) References Cited

U.S. PATENT DOCUMENTS

| | | | | |
|---|---|---|---|---|
| 9,543,242 | B1 | 1/2017 | Kelly et al. | |
| 10,032,748 | B2 | 7/2018 | Hiner et al. | |
| 10,784,232 | B2 | 9/2020 | Hiner et al. | |
| 10,833,052 | B2 | 11/2020 | Shih | |
| 10,957,650 | B2 | 3/2021 | Arvin et al. | |
| 11,127,699 | B2 * | 9/2021 | Lin | H01Q 1/2283 |
| 11,574,875 | B2 | 2/2023 | Rubin et al. | |
| 2021/0366885 | A1 * | 11/2021 | Chen | H10W 70/635 |
| 2022/0352075 | A1 | 11/2022 | Weng et al. | |
| 2023/0036283 | A1 | 2/2023 | Lin et al. | |
| 2023/0065615 | A1 * | 3/2023 | Kung | H10W 70/635 |
| 2025/0349808 | A1 * | 11/2025 | Chen | H10W 70/635 |
| 2025/0357351 | A1 * | 11/2025 | Olson | H10W 70/65 |

* cited by examiner

*Primary Examiner* — J. E. Schoenholtz
(74) *Attorney, Agent, or Firm* — Harness, Dickey & Pierce, P.L.C.

(57) ABSTRACT

A semiconductor package may include a first redistribution layer structure, a chiplet structure on the first redistribution layer structure, a plurality of first connection members on the first redistribution layer structure, a first molding material on the first redistribution layer structure and molding the chiplet structure and the plurality of first connection members, and a second redistribution layer structure on the first molding material. The chiplet structure may include a third redistribution layer structure, a first chiplet and a second chiplet on the third redistribution layer structure, and a bridge die on a bottom surface of the third redistribution layer structure.

20 Claims, 22 Drawing Sheets

A

130

130

130

130

100

100

100

100

100

100

100

100

SEMICONDUCTOR PACKAGE AND METHOD FOR MANUFACTURING THE SAME

CROSS-REFERENCE TO RELATED APPLICATION

This application claims priority to and the benefit of Korean Patent Application No. 10-2023-0107048 filed in the Korean Intellectual Property Office on Aug. 16, 2023, the entire contents of which are incorporated herein by reference.

BACKGROUND

(a) Field

The present disclosure relates to a semiconductor package and a method for manufacturing the same.

(b) Description of Related Art

The semiconductor industry seeks to increase integration density so that more passive or active devices can be integrated within a given area. Among them, the development of technology for miniaturizing a circuit line width of a front end process of semiconductor gradually has faced limitations, and accordingly, the semiconductor industry tends to supplement limitations of the front-end processes of semiconductor by developing semiconductor package techniques capable of having high integration densities. According to this trend, semiconductor manufacturing technology is being developed to manufacture a processor with a three-dimensional integrated circuit (3DIC) by stacking chiplets. Chiplets may be classified according to function. Inexpensive old processes may be applied to manufacture chiplets. If a processor is manufactured by combining chiplets manufactured according to the latest process or the old process, it may be possible to overcome the performance limitations of single-chip processors.

In a processor manufactured in the form of a three-dimensional integrated circuit (3DIC) by stacking chiplets, a hot spot area in which heat accumulates may be created due to the stacked structure. Since thermal resistance may increase in these hot spot areas, the accumulated heat may be dissipated by increasing the height of a three-dimensional integrated circuit (3DIC) made of silicon having relatively high thermal conductivity.

However, when the height of the three-dimensional integrated circuit (3DIC) is increased, the height of the conductive posts disposed side by side with the three-dimensional integrated circuit (3DIC) in the package-on-package (POP) must also be increased. When the height of the conductive posts is increased, the same processes such as exposure, development, etching, and deposition may need to be additionally performed to form the conductive posts, and accordingly, the process turnaround time (TAT) may increase. Therefore, there may be a risk of deteriorating yield during the process of forming the conductive post.

In addition, if the processor is manufactured in the form of a three-dimensional integrated circuit (3DIC), in which chiplets are stacked, the process turnaround time (TAT) of the semiconductor package also may increase, and additional equipment, such as hybrid bonding equipment and CMP equipment, may be required for manufacturing the three-dimensional integrated circuit (3DIC), thereby increasing the manufacturing cost.

Therefore, it may be necessary to develop of a new semiconductor package technology to solve problems of conventional semiconductor package technology.

SUMMARY

The present disclosure relates a new chiplet structure in a package-on-package (POP), in which chiplets are disposed side by side on an upper surface of a redistribution layer structure (RDL) and a bridge die is disposed on a bottom surface of the redistribution layer structure (RDL), such that the chiplets may communicate signals through a path passing through I/Os of chiplets in a fine pitch, the redistribution layer structure, and the bridge die.

According to an example embodiment, a semiconductor package may include a first redistribution layer structure; a chiplet structure on the first redistribution layer structure; a plurality of first connection members on the first redistribution layer structure; a first molding material on the first redistribution layer structure and molding the chiplet structure and the plurality of first connection members; and a second redistribution layer structure on the first molding material. The chiplet structure may include a third redistribution layer structure, a first chiplet and a second chiplet on the third redistribution layer structure, and a bridge die on a bottom surface of the third redistribution layer structure.

According to an example embodiment, a semiconductor package may include a first redistribution layer structure; a first chiplet structure on the first redistribution layer structure; a plurality of connection members on the first redistribution layer structure; a first molding material on the first redistribution layer structure and molding the first chiplet structure and the plurality of connection members; a second redistribution layer structure on the first molding material; and a second chiplet structure on the second redistribution layer structure.

The first chiplet structure may include a third redistribution layer structure, a first chiplet and a second chiplet on the third redistribution layer structure, and a first bridge die on a bottom surface of the third redistribution layer structure. The second chiplet structure may include a fourth redistribution layer structure, a third chiplet and a fourth chiplet on the fourth redistribution layer structure, and a second bridge die on a bottom surface of the fourth redistribution layer structure.

According to an example embodiment, a method for manufacturing a semiconductor package may include forming a first redistribution layer structure on a first carrier; forming a plurality of connection members on the first redistribution layer structure; mounting a chiplet structure on the first redistribution layer structure; molding the plurality of connection members and the chiplet structure using a first molding material on the first redistribution layer structure; and forming a second redistribution layer structure on the first molding material. The chiplet structure includes a third redistribution layer structure, a first chiplet and a second chiplet on the third redistribution layer structure, and a bridge die on a bottom surface of the third redistribution layer structure.

By disposing chiplets side by side on an upper surface of redistribution layer structure (RDL) and by disposing a bridge die on bottom surface of redistribution layer structure (RDL), a new chiplet structure may be provided to a package-on-package (POP) such that the chiplets may communicate signals through a path passing through I/Os of chiplets in a fine pitch, the redistribution layer structure, and the bridge die.

By disposing the chiplets side by side rather than stacking, thermal resistance generated in the chiplet structure may be decreased, the process turnaround time (TAT) for forming the conductive posts may be decreased, the overall process turnaround time (TAT) of the semiconductor package also may be decreased; and investment costs for additional equipment such as a hybrid bonding facility and a CMP facility for manufacturing the three-dimensional integrated circuit (3DIC) may be reduced.

By disposing a first chiplet structure within a lower structure of a package-on-package (POP) and disposing a second chiplet structure within an upper structure of package-on-package (POP), a semiconductor package according to present disclosure may be expanded to include various types of chips according to its purpose and function.

DETAILED DESCRIPTION

Figure 1:
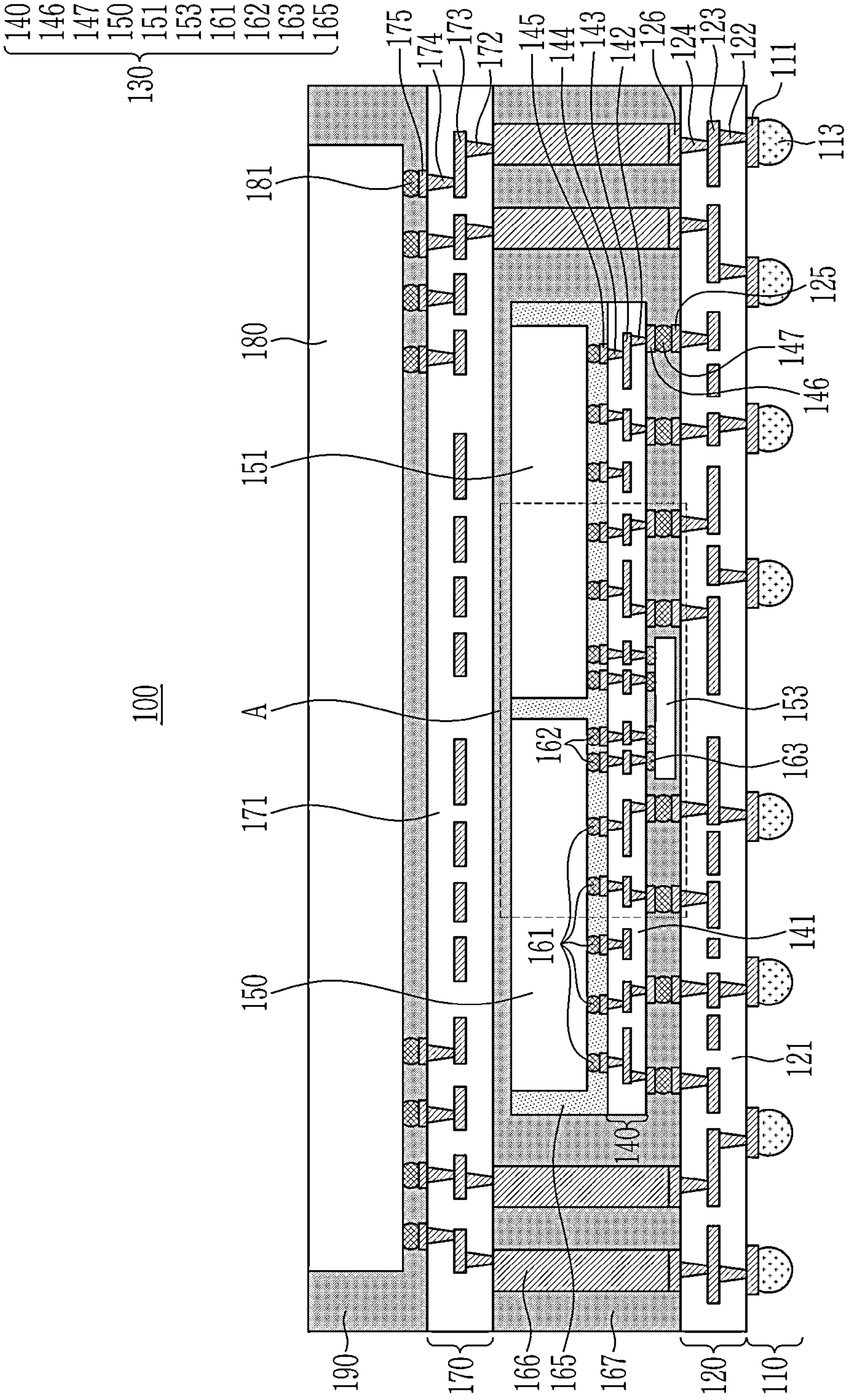
FIG. 1 is a cross-sectional view showing a semiconductor package of an embodiment.

Hereinafter, embodiments of the disclosure will be described in detail with reference to the accompanying drawings, such that those skilled in the art may easily implement embodiments of the disclosure. The disclosure may be implemented in various forms, and may not necessarily limited to embodiments described herein.

The drawings and description are to be regarded as illustrative in nature and not restrictive. Like reference numerals designate like elements throughout the specification.

Further, in the drawings, the size and thickness of each element are illustrated for ease of description, and the present disclosure is not necessarily limited to those illustrated in the drawings.

Throughout this specification and the claims that follow, when it is described that an element is "coupled or connected" to another element, the element may be "directly coupled or connected" to the other element or "indirectly coupled or connected" to the other element through a third element. In addition, unless explicitly described to the contrary, the word "comprise" and variations such as "comprises" or "comprising" will be understood to imply the inclusion of stated elements but not the exclusion of any other elements. It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Hereinafter, a semiconductor package and a method for manufacturing the semiconductor package, of an embodiment, will be described with reference to drawings.

FIG. 1 is a cross-sectional view showing a semiconductor package 100 of an embodiment. The semiconductor package 100 may include a chiplet structure 130 on a front side redistribution layer structure 120, and may include a memory structure 180 on a back-side redistribution layer structure 170.

Referring to FIG. 1, the semiconductor package 100 may include an external connection structure 110, the front side redistribution layer structure (first redistribution layer structure) 120, the chiplet structure (first chiplet structure) 130, conductive posts (first connection members) 166, a first molding material 167, the back-side redistribution layer structure (second redistribution layer structure) 170; the memory structure 180, and a fourth molding material 190. In an embodiment, the semiconductor package 100 may include a package-on-package (POP). In an embodiment, the semiconductor package 100 may include a fan-out wafer level package (FOWLP) or a fan-out panel level package (FOPLP).

The external connection structure 110 may be disposed on a bottom surface of the front side redistribution layer structure 120. The external connection structure 110 may include conductive pads 111 and external connection members 113. A conductive pad 111 may electrically connect a first redistribution via 122 of the front side redistribution layer structure 120 to an external connection member 113. The external connection member 113 may electrically connect the semiconductor package 100 to external device (not shown).

The front side redistribution layer structure 120 may include a first dielectric material layer 121, a first redistribution vias 122, first redistribution lines 123, and a second redistribution vias 124 disposed within the first dielectric material layer 121, and first bonding pads 125 and second bonding pads 126 on the first dielectric material layer 121. In another embodiment, the front side redistribution layer structure 120 including a smaller and larger number of redistribution lines, redistribution vias, and bonding pads may be included in the scope of the present disclosure.

The first dielectric material layer 121 may protect and insulate the first redistribution vias 122, the first redistribution lines 123, and the second redistribution vias 124. The chiplet structure 130 and conductive posts 166 may be disposed on an upper surface of the first dielectric material layer 121. The external connection structure 110 may be disposed on a bottom surface of the first dielectric material layer 121.

The first redistribution via 122 may be disposed between a first redistribution line 123 and the conductive pad 111. The first redistribution via 122 may electrically connect the first redistribution line 123 to the external connection member 113 connected to the conductive pad 111, in a vertical direction. The first redistribution line 123 may be disposed between the first redistribution via 122 and a second redistribution via 124. The first redistribution line 123 may electrically connect the first redistribution via 122 and the second redistribution via 124, in a horizontal direction. The second redistribution via 124 may be disposed between a first bonding pad 125 and the first redistribution line 123, and between a second bonding pad 126 and the first redistribution line 123. The second redistribution via 124 may electrically connect the first bonding pad 125 to the first redistribution line 123, and the second bonding pad 126 to the first redistribution line 123, in the vertical direction.

The first bonding pad 125 may be disposed between the second redistribution via 124 and a connection member 147 of the chiplet structure 130. The first bonding pad 125 may electrically connect the connection member 147 of the chiplet structure 130 to the second redistribution via 124, in the vertical direction.

The second bonding pad 126 may be disposed between the second redistribution via 124 and a conductive post 166. The second bonding pad 126 may electrically connect the conductive post 166 to the second redistribution via 124, in the vertical direction.

The chiplet structure 130 may be disposed on the front side redistribution layer structure 120. The chiplet structure 130 may include a third redistribution layer structure 140, connection pads 146, connection members 147, a first chiplet 150, a second chiplet 151, second connection members 161, third connection members 162, bridge die (first bridge die) 153, and a second molding material 165. Unlike a processor manufactured in the form of a three-dimensional integrated circuit (3DIC) by stacking the chiplets in the vertical direction, the chiplet structure 130 according to present disclosure may be configured by disposing a plurality of chiplets side by side in the horizontal direction. Accordingly, thermal resistance generated in the chiplet structure 130 may be decreased.

The third redistribution layer structure 140 may include a third dielectric material layer 141, fifth redistribution vias 142, third redistribution lines 143, and sixth redistribution vias 144 disposed within the third dielectric material layer 141, and fourth bonding pads 145 on the third dielectric material layer 141. In another embodiment, the third redistribution layer structure 140 including a smaller and larger number of redistribution lines, redistribution vias, and bonding pads may be included in the scope of the present disclosure. The third redistribution layer structure 140 may serve to electrically connect I/O structures (e.g., second connection members 161) of a first pitch W1 of the first chiplet 150 and the second chiplet 151 (refer to FIG. 2) to the front side redistribution layer structure 120 via the connection members 147, and to electrically connect I/O structures (e.g., third connection members 162) of a second pitch W2 (refer to FIG. 2) of the first chiplet 150 and the second chiplet 151 to a bridge die 153.

The third dielectric material layer 141 may protect and insulate the fifth redistribution vias 142, the third redistribution lines 143, and the sixth redistribution vias 144. The second molding material 165 may be disposed on an upper surface of the third dielectric material layer 141. The connection pads 146 and the connection members 147 may be disposed on a bottom surface of the third dielectric material layer 141.

A fifth redistribution via 142 may be disposed between a third redistribution line 143 and a connection pad 146. The fifth redistribution via 142 may electrically connect the third redistribution line 143 to the connection member 147 connected to the connection pad 146, in the vertical direction. The third redistribution line 143 may be disposed between the fifth redistribution via 142 and a sixth redistribution via 144. The third redistribution line 143 may electrically connect the fifth redistribution via 142 and the sixth redistribution via 144, in the horizontal direction. The sixth redistribution via 144 may be disposed between a fourth bonding pad 145 and the third redistribution line 143. The sixth redistribution via 144 may electrically connect the fourth bonding pad 145 to the third redistribution line 143, in the vertical direction.

The fourth bonding pad 145 may be disposed between a second connection member 161 of the first chiplet 150 and the sixth redistribution via 144, between a third connection member 162 of the first chiplet 150 and the sixth redistribution via 144, between the second connection member 161 of the second chiplet 151 and the sixth redistribution via 144, and between the sixth redistribution via 144 and the third connection member 162 of the second chiplet 151. The fourth bonding pad 145 may electrically connect the second connection member 161 and the third connection member 162 to the sixth redistribution via 144, in the vertical direction.

The connection pads 146 and the connection members 147 may be disposed on a bottom surface of the third redistribution layer structure 140. The connection pad 146 may be disposed between the fifth redistribution via 142 and the connection member 147. The connection pad 146 may electrically connect the fifth redistribution via 142 to the connection member 147. The connection member 147 may be disposed between the connection pad 146 and the first bonding pad 125. The connection member 147 may electrically connect the connection pad 146 to the first bonding pad 125.

The first chiplet 150 and the second chiplet 151 may be disposed side by side on the third redistribution layer structure 140. A chiplet is a block manufactured by distinguishing components of a high-performance processor according to functions. Configurations of processors that does not require the use of the latest processes may be manufactured as chiplets by applying inexpensive existing processes, and configurations of processors that require the use of the latest processes may be manufactured as chiplets by applying the latest processes. As such, the chiplets may be separately manufactured according to functions, and a single high-performance processor may be manufactured by connecting the manufactured chiplets. Each chiplet cannot operate as a unit chip, and a high-performance processor manufactured by connecting these chiplets may overcome the performance limitations of single-chip processors.

The first chiplet 150 may include a logic circuit. In an embodiment, the first chiplet 150 may include at least one of a central processing unit (CPU) and a graphic processing unit (GPU). The first chiplet 150 may be electrically connected to the third redistribution layer structure 140 by the second connection members 161 and the third connection members 162. Side surfaces of the first chiplet 150 may be surrounded by the second molding material 165. An upper surface of the first chiplet 150 may be surrounded by the first molding material 167.

The second chiplet 151 may be disposed side by side with the first chiplet 150. In an embodiment, the second chiplet 151 may include a static random access memory (SRAM). The second chiplet 151 may be electrically connected to the third redistribution layer structure 140 by the second connection members 161 and the third connection members 162. Side surfaces of the second chiplet 151 may be surrounded by the second molding material 165. An upper surface of the second chiplet 151 may be surrounded by the first molding material 167.

The second connection member 161 and the third connection member 162 may be disposed between the fourth bonding pad 145 of the third redistribution layer structure 140 and the first chiplet 150, and between the second chiplet 151 and the fourth bonding pad 145 of the third redistribution layer structure 140. The second connection member 161 and the third connection member 162 may electrically connect the first chiplet 150 to the fourth bonding pad 145 of the third redistribution layer structure 140, and the second chiplet 151 to the fourth bonding pad 145 of the third redistribution layer structure 140.

The bridge die 153 may be disposed on the bottom surface of the third redistribution layer structure 140. The bridge die 153 may serve to exchange signals between the first chiplet 150 and the second chiplet 151, via the third redistribution layer structure 140 and a plurality of third connection members 162. The bridge die 153 may include connection members 163. A connection member 163 may be electrically connected to the fifth redistribution via 142 of the third redistribution layer structure 140.

The second molding material 165 may be disposed on the third redistribution layer structure 140, and configured to mold the first chiplet 150 and the second chiplet 151.

The conductive posts 166 may be disposed on an upper surface of the front side redistribution layer structure 120. The conductive post 166 may be disposed between the second bonding pad 126 and a third redistribution via 172 of the back-side redistribution layer structure 170. The conductive post 166 may electrically connect the third redistribution via 172 of the back-side redistribution layer structure 170 to the second bonding pad 126. The conductive post 166 may be disposed to penetrate the first molding material 167. A side surface of the conductive post 166 may be surrounded by the first molding material 167.

The first molding material 167 may mold the chiplet structure 130 and the conductive posts 166, on the front side redistribution layer structure 120. The first molding material 167 may protect the chiplet structure 130 and the conductive posts 166 from external environments, and accordingly, the semiconductor package 100 may secure electrical or mechanical stability. The first molding material 167 may include a material of a different type from the second molding material 165. In addition, according to the present disclosure, the first chiplet 150 and the second chiplet 151 may be protected by being surrounded by the second molding material 165 and the first molding material 167.

The back-side redistribution layer structure 170 may be disposed on the conductive posts 166 and the first molding material 167. The back-side redistribution layer structure 170 may include a second dielectric material layer 171, a third redistribution vias 172, second redistribution lines 173, and a fourth redistribution vias 174 disposed within the second dielectric material layer 171, and third bonding pads 175 on the second dielectric material layer 171. In another embodiment, the back-side redistribution layer structure 170 including a smaller and larger number of redistribution lines, redistribution vias, and bonding pads is included in the scope of the present disclosure.

The second dielectric material layer 171 protects and insulates the third redistribution vias 172, the second redistribution lines 173, and the fourth redistribution vias 174. The memory structure 180 may be disposed on an upper surface of the second dielectric material layer 171. The conductive posts 166 and the first molding material 167 may be disposed on a bottom surface of the second dielectric material layer 171.

The third redistribution via 172 may be disposed between the conductive post 166 and a second redistribution line 173. The third redistribution via 172 may electrically connect the second redistribution line 173 to the conductive post 166, in the vertical direction. The second redistribution line 173 may be disposed between the third redistribution via 172 and a fourth redistribution via 174. The second redistribution line 173 may electrically connect the third redistribution via 172 and the fourth redistribution via 174, in the horizontal direction.

The fourth redistribution via 174 may be disposed between the second redistribution line 173 and a third bonding pad 175. The fourth redistribution via 174 may electrically connect the third bonding pad 175 to the second redistribution line 173, in the vertical direction. The third bonding pad 175 may be disposed between the fourth redistribution via 174 and a connection member 181 of the memory structure 180. The third bonding pad 175 may electrically connect the connection member 181 of the memory structure 180 to the fourth redistribution via 174.

The memory structure 180 may be disposed on the back-side redistribution layer structure 170. In an embodiment, the memory structure 180 may include a single chip such as a DRAM, or a multi-chip such as a high bandwidth memory (HBM). The memory structure 180 may include connection members 181. The connection member 181 may electrically connect the memory structure 180 to the back-side redistribution layer structure 170.

The fourth molding material 190 may mold the memory structure 180, on the back-side redistribution layer structure 170. The fourth molding material 190 may protect the memory structure 180 from external environments, and accordingly, the semiconductor package 100 may secure electrical or mechanical stability.

Figure 2:
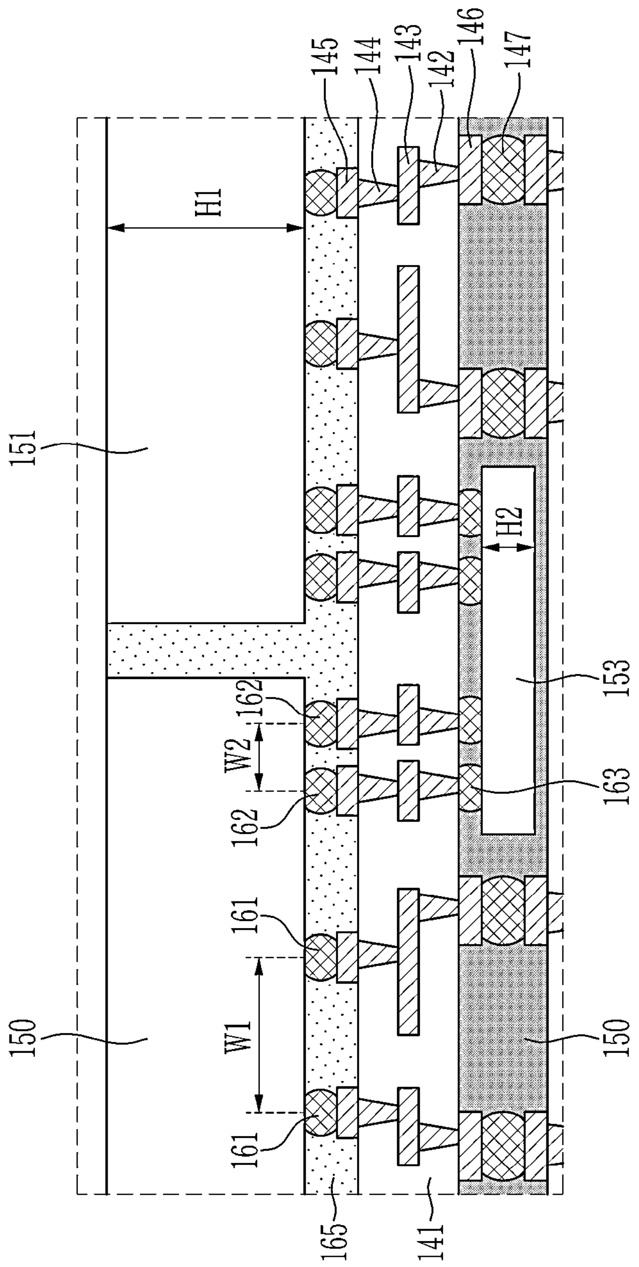
FIG. 2 is an enlarged cross-sectional view of region A in FIG. 1.

FIG. 2 is an enlarged cross-sectional view of region A in FIG. 1.

Referring to FIG. 2, the first chiplet 150 and the second chiplet 151 may have I/Os of a first interval W1 and I/Os of a second interval W2, in the horizontal direction. The first interval W1 may be larger than the second interval W2. In an embodiment, the first interval W1 may be about 50 μm to about 300 μm. In an embodiment, the second interval W2 may be about 0.1 μm to about 50 μm.

The first chiplet 150 and the second chiplet 151 may send and receive signal and electrical power with external device (not shown) through a path passing through the second connection members 161 arranged with the first interval W1, the third redistribution layer structure 140, the connection pads 146, the connection members 147, and the front side redistribution layer structure 120. The first chiplet 150 and the second chiplet 151 may send and receive signal with the memory structure 180 through a path passing through the second connection members 161 arranged with the first interval W1, the third redistribution layer structure 140, the connection pads 146, the connection members 147, the front side redistribution layer structure 120, the conductive posts 166, and the back-side redistribution layer structure 170. The first chiplet 150 and the second chiplet 151 may communicate signals through a path passing through the third connection members 162 arranged with the second interval W2, the third redistribution layer structure 140, and the bridge die 153.

In an embodiment, a width of the second connection members 161 in the horizontal direction may be larger than a width of the third connection members 162 in the horizontal direction. In an embodiment, a thickness of the first chiplet 150 and the second chiplet 151 in the vertical direction may be larger than a thickness of the bridge die 153 in the vertical direction.

Figure 3:
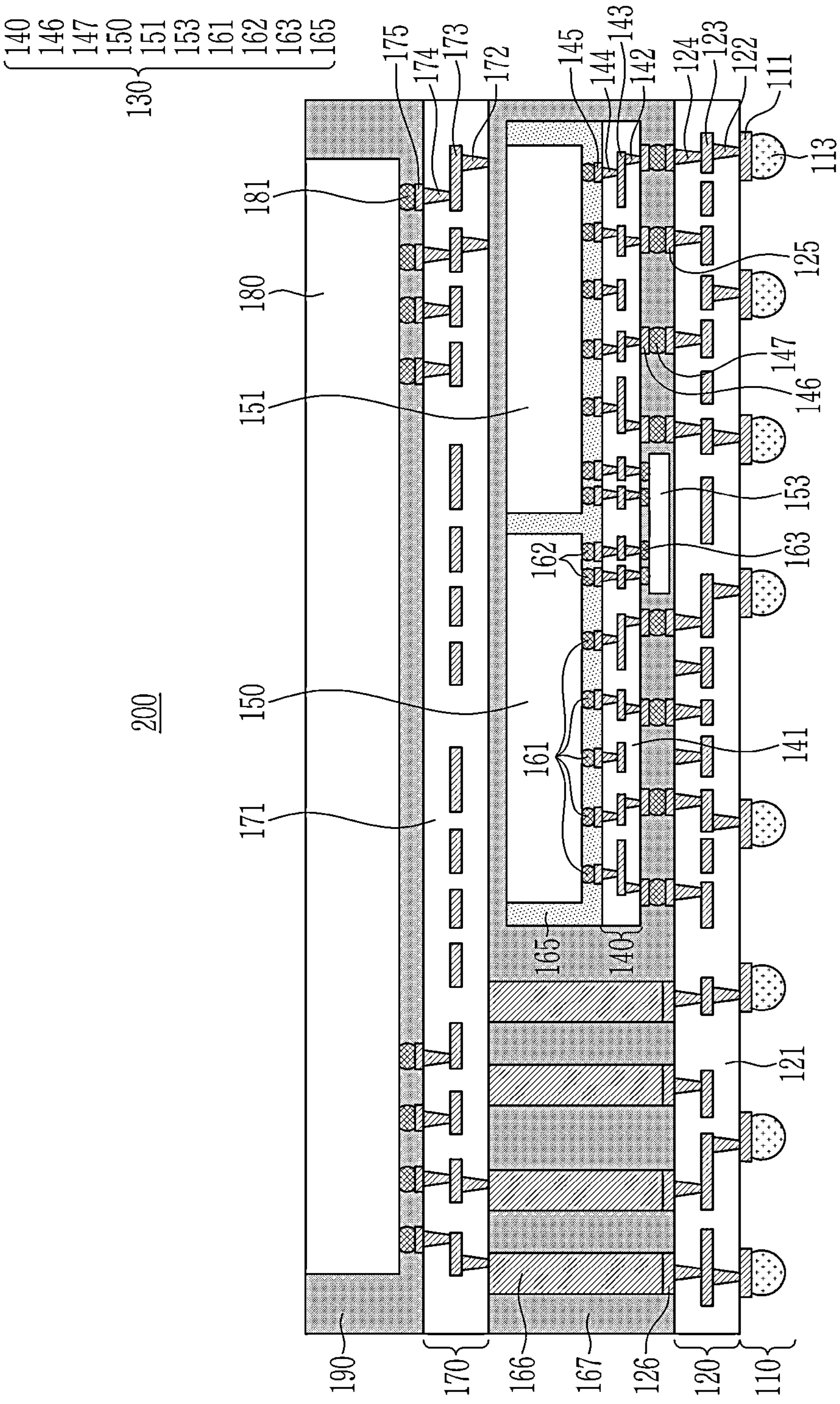
FIG. 3 is a cross-sectional view showing a semiconductor package of another embodiment.

FIG. 3 is a cross-sectional view showing a semiconductor package 200 of another embodiment.

Referring to FIG. 3, unlike that the conductive posts 166 disposed at both lateral sides of the chiplet structure 130 in FIG. 1, the conductive posts 166 may be disposed at one lateral side of the chiplet structure 130. Configurations disclosed in FIG. 1 may be equally applied to configurations other than that the conductive posts 166 are disposed at the one lateral side of the chiplet structure 130 in FIG. 3.

Figure 4:
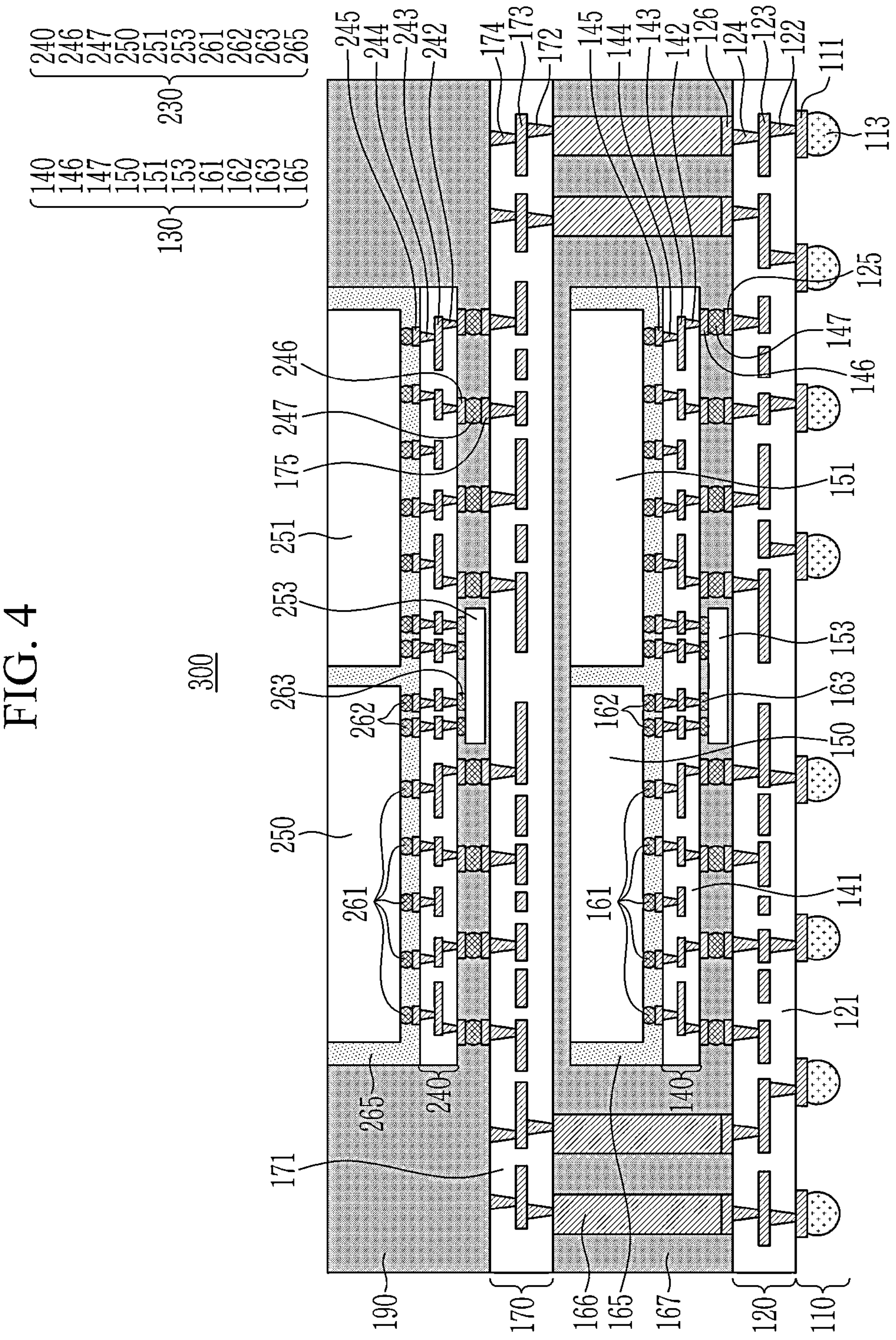
FIG. 4 is a cross-sectional view showing a semiconductor package of a still another embodiment.

FIG. 4 is a cross-sectional view showing a semiconductor package 300 of still another embodiment.

Referring to FIG. 4, unlike that the memory structure 180 is disposed on the back-side redistribution layer structure 170 in FIG. 1, a second chiplet structure 230 may be disposed on the back-side redistribution layer structure 170. Configurations disclosed in FIG. 1 may be equally applied to configurations other than that the second chiplet structure 230 is disposed on the back-side redistribution layer structure 170.

The second chiplet structure 230 may be disposed on the back-side redistribution layer structure 170. The second chiplet structure 230 may include a fourth redistribution layer structure 240, connection pads 246, connection members 247, a third chiplet 250, a fourth chiplet 251, fourth connection members 261, fifth connection members 262, a second bridge die 253, and a third molding material 265. The fourth redistribution layer structure 240 may include a fourth dielectric material layer 241, a seventh redistribution vias 242, fourth redistribution lines 243, and an eighth redistribution vias 244 disposed within the fourth dielectric material layer 241, and fifth bonding pads 245 on the fourth dielectric material layer 241. In another embodiment, the fourth redistribution layer structure 240 including a smaller and larger number of redistribution lines, redistribution vias, and bonding pads may be included in the scope of the present disclosure. Description of the third redistribution layer structure 140, the connection pads 146, the connection members 147, the second connection members 161, the third connection members 162, bridge die (first bridge die) 153, and the second molding material 165 of the first chiplet structure 130 of FIG. 1 may be equally applied to with respect to the fourth redistribution layer structure 240, the connection pads 246, the connection members 247, the fourth connection members 261, the fifth connection members 262, the second bridge die 253, and the third molding material 265 of the second chiplet structure 230, respectively.

The third chiplet 250 and the fourth chiplet 251 may be disposed side by side on the fourth redistribution layer structure 240. In an embodiment, the third chiplet 250 may include processing circuitry, which may include at least one of power management unit, clock unit, communication unit, and sensor. The fourth chiplet 251 may include DRAM. Side surfaces of the third chiplet 250 and the fourth chiplet 251 may be surrounded by the third molding material 265. Upper surfaces of the third chiplet 250 and the fourth chiplet 251 may be exposed to the outside.

By disposing the first chiplet structure 130 within lower structure of the semiconductor package 300 and by disposing the second chiplet structure 230 within upper structure of the semiconductor package 300, a semiconductor package according to present disclosure may be expanded to include various types of chips according to its purpose and function.

FIG. 5 to FIG. 11 are a cross-sectional view showing a method of manufacturing the chiplet structure 130.

Figure 5:
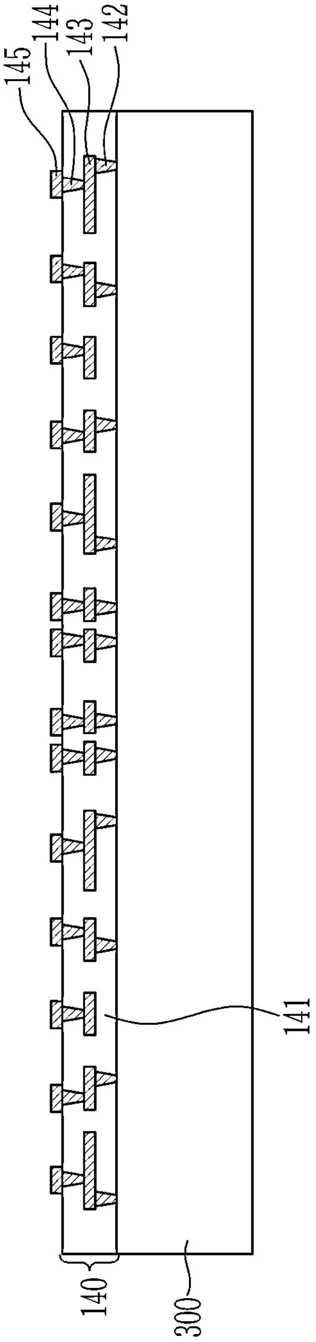
FIG. 5 to FIG. 11 are a cross-sectional view showing a method of manufacturing a chiplet structure.

FIG. 5 is a cross-sectional view showing forming of the third redistribution layer structure 140 on a first carrier 300.

Referring to FIG. 5, the third redistribution layer structure 140 may be formed on the first carrier 300. First, the first carrier 300 may be provided. The first carrier 300 may include, for example, a silicon-based material such as glass or silicon oxide, an organic material, or another material such as aluminum oxide, any combination of these materials, and the like.

Then, the third dielectric material layer 141 may be formed on the first carrier 300. In one embodiment, the third dielectric material layer 141 may include a photoimageable dielectric (PID) used in a redistribution process. A photoimageable dielectric is a material capable of forming a fine pattern by applying a photolithography process. In an embodiment, the photoimageable dielectric (PID) may include polyimide-based photoactive polymer, novolac-based photoactive polymer, polybenzoxazole, silicone-based polymer, acrylate-based polymer, or epoxy-based polymer. In an embodiment, the third dielectric material layer 141 may be formed of an inorganic dielectric material such as silicon nitride, silicon oxide, and the like. In an embodiment, the third dielectric material layer 141 may be formed by a CVD, ALD, or PECVD process.

After forming the third dielectric material layer 141, the third dielectric material layer 141 may be selectively etched to form via holes, and via holes may be filled with a conductive material to form the fifth redistribution vias 142.

Then, the third dielectric material layer 141 may be additionally deposited on the fifth redistribution vias 142 and the third dielectric material layer 141, the additionally deposited third dielectric material layer 141 may be selectively etched to form openings, and the openings may be filled with a conductive material to form the third redistribution lines 143.

Then, the third dielectric material layer 141 may be additionally deposited on the third redistribution lines 143 and the third dielectric material layer 141, the additionally deposited third dielectric material layer 141 may be selectively etched to form via holes, and via holes may be filled with a conductive material to form the sixth redistribution vias 144.

Then, photoresist (not shown) may be additionally deposited on the sixth redistribution vias 144 and the third dielectric material layer 141, the photoresist may be selectively exposed and developed to form a photoresist pattern including openings, and the openings may be filled with a conductive material to form the fourth bonding pads 145.

In an embodiment, the fifth redistribution vias 142, the third redistribution lines 143, the sixth redistribution vias 144, and the fourth bonding pads 145 may include at least one of copper, aluminum, tungsten, nickel, gold, tin, titanium and an alloy thereof. In an embodiment, the fifth redistribution vias 142, the third redistribution lines 143, the sixth redistribution vias 144, and the fourth bonding pads 145 may be formed by performing a sputtering process. In another embodiment, the fifth redistribution vias 142, the third redistribution lines 143, the sixth redistribution vias 144, and the fourth bonding pads 145 may be formed by forming a seed metal layer and then performing an electrolytic plating process.

Figure 6:
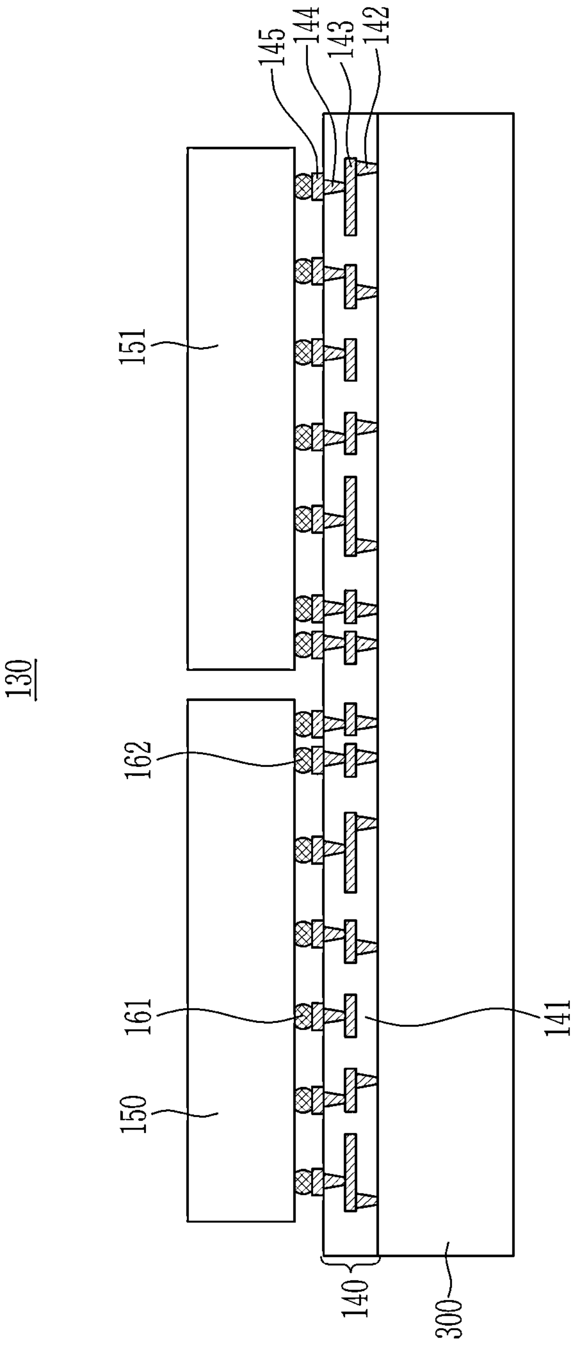

FIG. 6 is a cross-sectional view showing mounting of the first chiplet 150 and the second chiplet 151 on the third redistribution layer structure 140.

Referring to FIG. 6, the first chiplet 150 and the second chiplet 151 may be mounted on the third redistribution layer structure 140 by flip chip bonding. The first chiplet 150 and the second chiplet 151 may be disposed side by side and horizontally at a same level. The second connection members 161 and the third connection members 162 of bottom surfaces of the first chiplet 150 and the second chiplet 151 may be bonded to the fourth bonding pads 145 of the third redistribution layer structure 140, such that the first chiplet 150 and the second chiplet 151, and the third redistribution layer structure 140 may be electrically connected. In an embodiment, the second connection member 161 and the third connection member 162 may include micro-bumps or solder balls. In an embodiment, the second connection member 161 and the third connection member 162 may include at least one of tin, silver, lead, nickel, copper or an alloy thereof.

Figure 7:
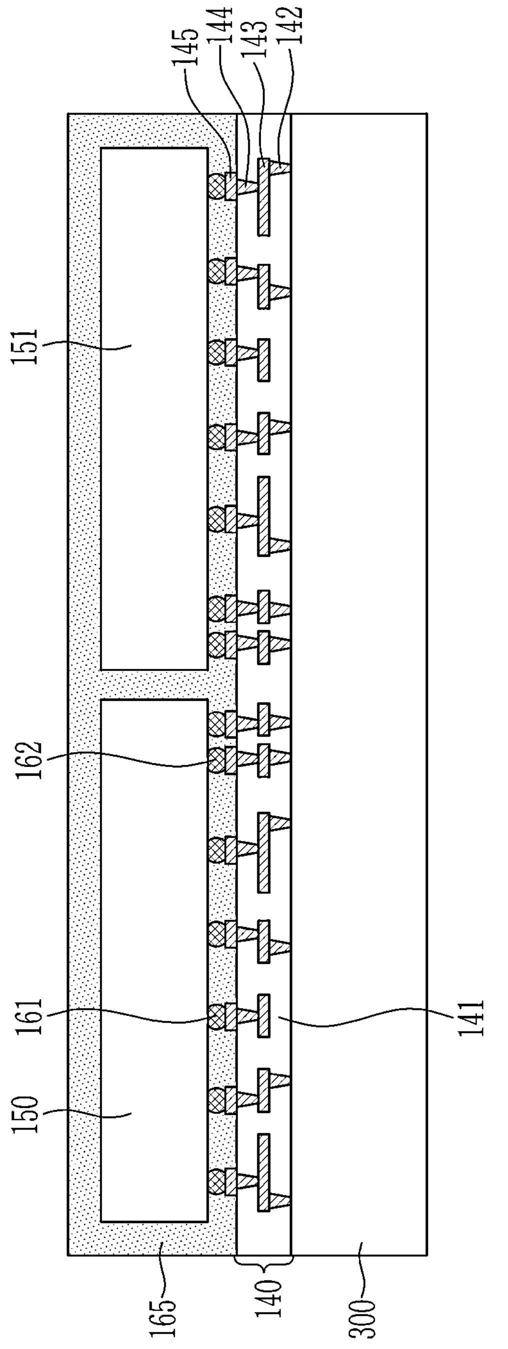

FIG. 7 is a cross-sectional view showing molding of the first chiplet 150 and the second chiplet 151 by the second molding material 165, on the third redistribution layer structure 140.

Referring to FIG. 7, on the third redistribution layer structure 140, the first chiplet 150 and the second chiplet 151 may be molded by the second molding material 165. In an embodiment, process of molding with the second molding material 165 may include a compression molding or transfer molding process. In an embodiment, the second molding material 165 may include epoxy molding compound (EMC).

Figure 8:
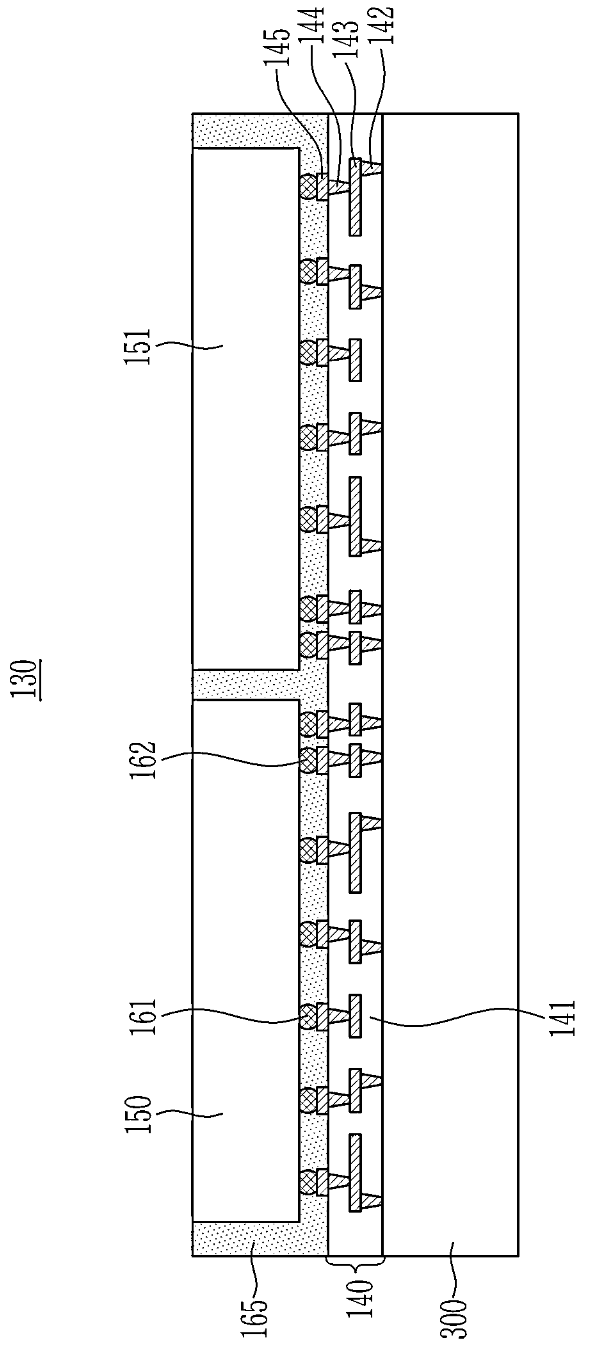

FIG. 8 is a cross-sectional view showing planarizing of the second molding material 165.

Referring to FIG. 8, a chemical mechanical polishing (CMP) may be performed in order to level an upper surface of the second molding material 165. The upper surface of the second molding material 165 may be planarized by applying the CMP process. After performing the CMP process, the upper surface of the first chiplet 150 and the second chiplet 151 may be exposed.

Figure 9:
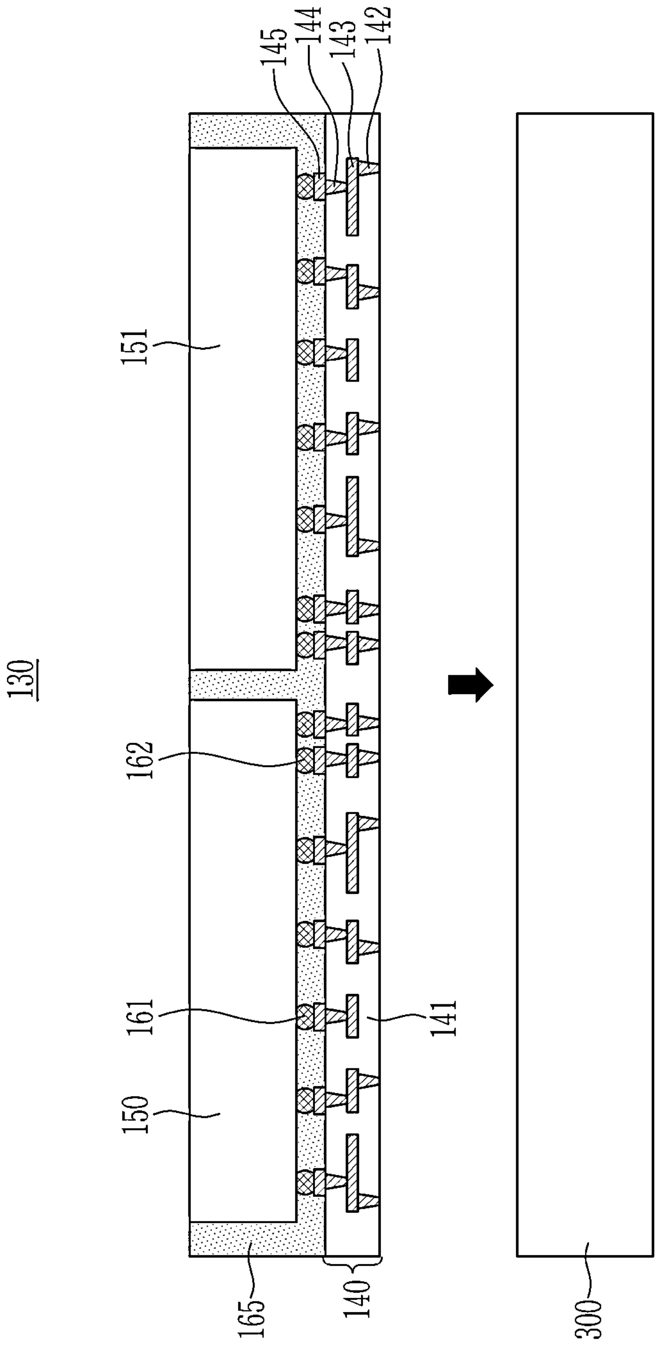

FIG. 9 is a cross-sectional view showing removing of the first carrier 300 from the third redistribution layer structure 140.

Referring to FIG. 9, the first carrier 300 may be removed from the bottom surface of the third redistribution layer structure 140.

Figure 10:
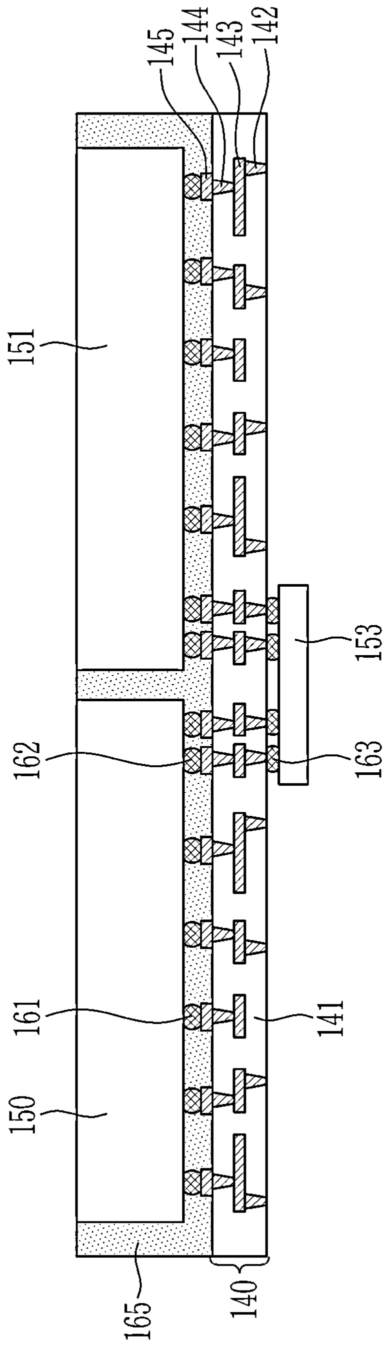

FIG. 10 is a cross-sectional view showing mounting of the bridge die 153 on the bottom surface of the third redistribution layer structure 140.

Referring to FIG. 10, the bridge die 153 may mounted on the bottom surface of the third redistribution layer structure 140 by flip chip bonding. The connection members 163 of an upper surface of the bridge die 153 may be bonded to the fifth redistribution vias 142 of the third redistribution layer structure 140, such that the bridge die 153 and the third redistribution layer structure 140 may be electrically connected. In an embodiment, the connection member 163 may include micro-bumps or solder balls. In an embodiment, the connection member 163 may include at least one of tin, silver, lead, nickel, copper or an alloy thereof.

Figure 11:
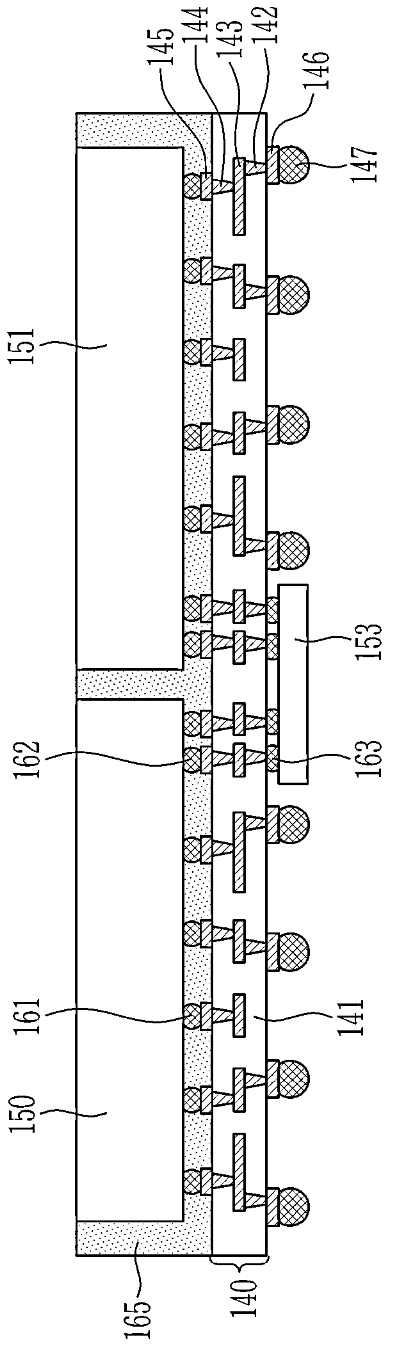

FIG. 11 is a cross-sectional view showing forming of the connection pads 146 and the connection members 147 on the bottom surface of the third redistribution layer structure 140.

Referring to FIG. 11, the connection pads 146 and the connection members 147 may be formed on the bottom surface of the third redistribution layer structure 140. The connection pads 146 may be formed under the fifth redistribution vias 142, and the connection members 147 may be formed under the connection pads 146. In an embodiment, the connection pad 146 may include at least one of copper, nickel, zinc, gold, silver, platinum, palladium, chromium, titanium and an alloy thereof. In an embodiment, the connection member 147 may include at least one of tin, silver, lead, nickel, copper or an alloy thereof. In an embodiment, the connection pad 146 may be formed by forming a sputtering process, or by forming seed metal layer and then performing an electrolytic plating process.

FIG. 12 to FIG. 22 are cross-sectional views showing a method of manufacturing the semiconductor package 100 of an embodiment of FIG. 1. A method of manufacturing the semiconductor package 100 of an embodiment of FIG. 1 shown in FIG. 12 to FIG. 22 may be applied to a method of manufacturing the semiconductor package 200 of another embodiment of FIG. 3 and the semiconductor package 300 of still another embodiment of FIG. 4.

Figure 12:
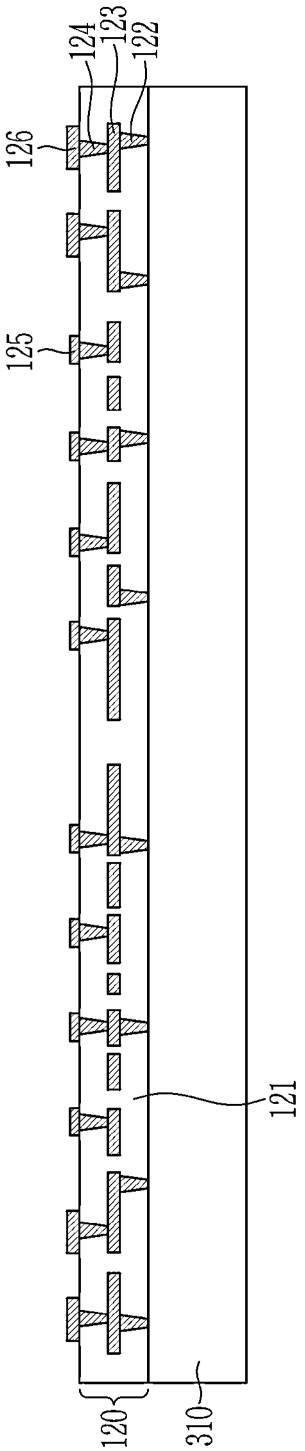
FIG. 12 to FIG. 22 are cross-sectional views showing a method of manufacturing a semiconductor package of an embodiment of FIG. 1.

FIG. 12 is a cross-sectional view showing forming of the front side redistribution layer structure 120 on a second carrier 310.

Referring to FIG. 12, the front side redistribution layer structure 120 may be formed on the second carrier 310. First, the second carrier 310 may be provided. The second carrier 310 may include, for example, a silicon-based material such as glass or silicon oxide, an organic material, or another material such as aluminum oxide, any combination of these materials, and the like.

Then, the first dielectric material layer 121 is formed on the second carrier 310. In an embodiment, the first dielectric material layer 121 may include the photoimageable dielectric (PID) used in a redistribution layer process. A photoimageable dielectric is a material capable of forming a fine pattern by applying a photolithography process. As an embodiment, the photoimageable dielectric (PID) may include polyimide-based photoactive polymer, novolac-based photoactive polymer, polybenzoxazole, silicone-based polymer, acrylate-based polymer, or epoxy-based polymer. In an embodiment, the first dielectric material layer 121 is formed of an inorganic dielectric material such as silicon nitride, silicon oxide, and the like. In an embodiment, the first dielectric material layer 121 may be formed by CVD, ALD, or PECVD process.

After forming the first dielectric material layer 121, the first dielectric material layer 121 may be selectively etched to form via holes, and via holes may be filled with a conductive material to form the first redistribution vias 122.

Then, the first dielectric material layer 121 may be additionally deposited on the first redistribution vias 122 and the first dielectric material layer 121, the additionally deposited first dielectric material layer 121 may be selectively etched to form openings, and the openings may be filled with a conductive material to form the first redistribution lines 123.

Then, the first dielectric material layer 121 may be additionally deposited on the first redistribution lines 123 and the first dielectric material layer 121, the additionally deposited first dielectric material layer 121 may be selectively etched to form via holes, and via holes may be filled with a conductive material to form the second redistribution vias 124.

Then, photoresist (not shown) may be additionally deposited on the second redistribution vias 124 and the first dielectric material layer 121, the photoresist may be selectively exposed and developed to form a photoresist pattern including openings, and the openings may be filled with a conductive material to form the first bonding pads 125 and the second bonding pads 126.

In an embodiment, the first redistribution vias 122, the first redistribution lines 123, the second redistribution vias

124, the first bonding pads 125, and the second bonding pads 126 may include at least one of copper, aluminum, tungsten, nickel, gold, tin, titanium and an alloy thereof. In an embodiment, the first redistribution vias 122, the first redistribution lines 123, the second redistribution vias 124, the first bonding pads 125, and the second bonding pads 126 may be formed by performing a sputtering process. In another embodiment, the first redistribution vias 122, the first redistribution lines 123, the second redistribution vias 124, the first bonding pads 125, and the second bonding pads 126 may be formed by forming a seed metal layer and then performing an electrolytic plating process.

Figure 13:
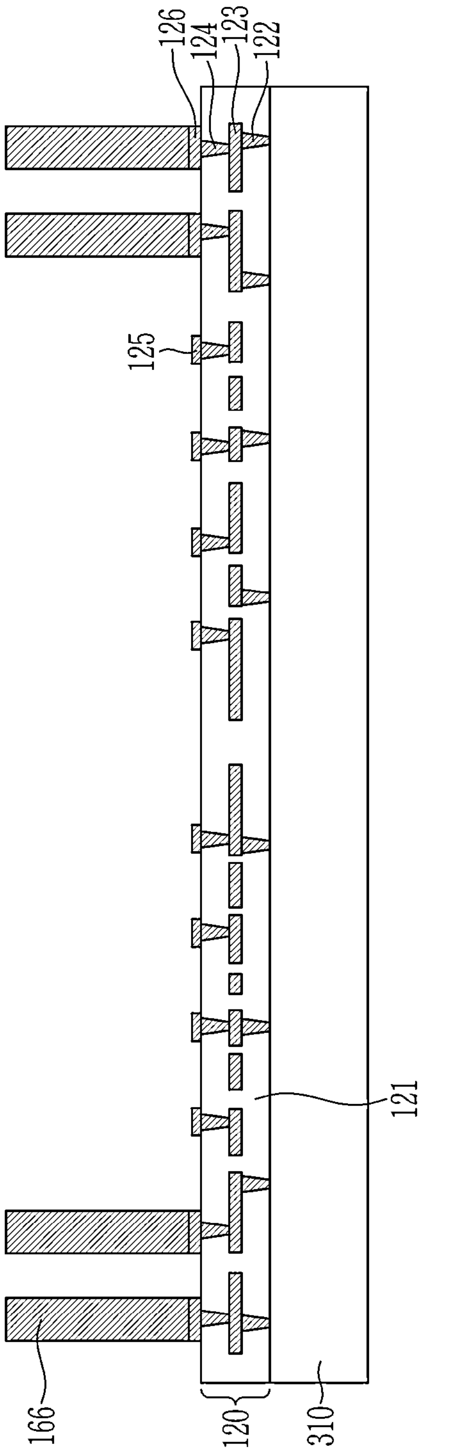

FIG. 13 is a cross-sectional view showing forming of the conductive posts 166 on the front side redistribution layer structure 120.

Referring to FIG. 13, the conductive posts 166 may be vertically formed on the second bonding pads 126 of the front side redistribution layer structure 120. In an embodiment, the conductive posts 166 may be formed by performing a sputtering process. In another embodiment, the conductive posts 166 may be formed by forming a seed metal layer and then performing an electrolytic plating process. In an embodiment, the conductive post 166 may include at least one of copper, aluminum, tungsten, nickel, gold, silver, chromium, antimony, tin, titanium and an alloy thereof.

Figure 14:
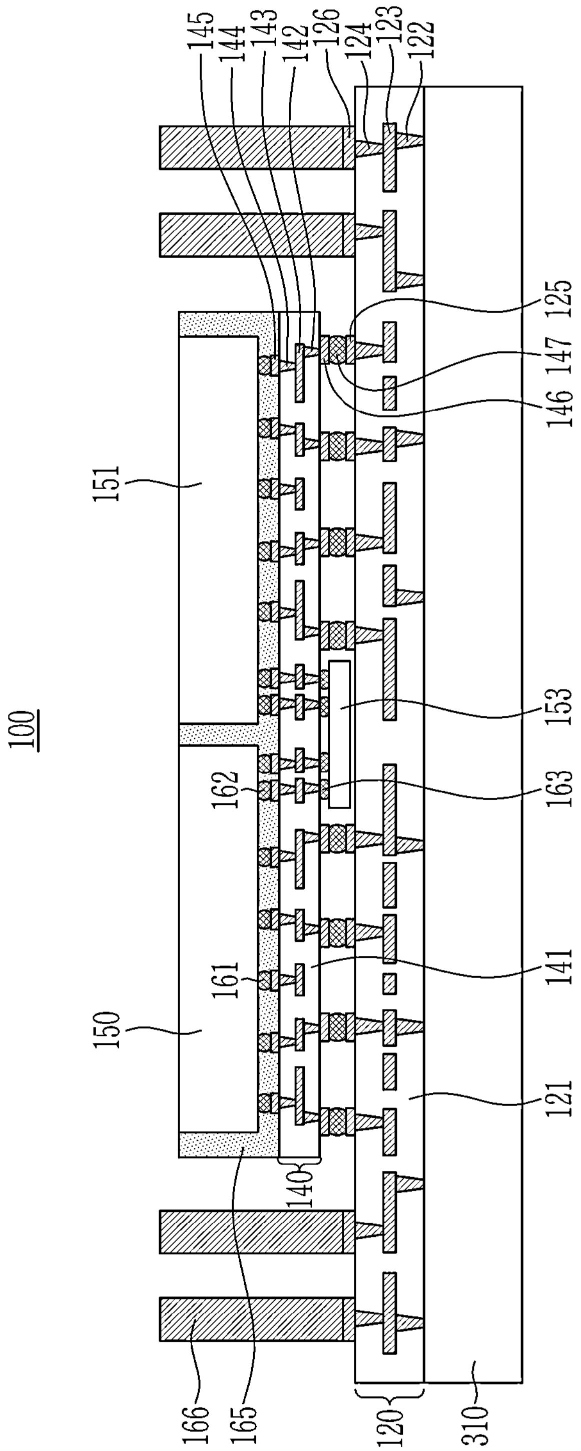

FIG. 14 is a cross-sectional view showing mounting of the chiplet structure 130 on the front side redistribution layer structure 120.

Referring to FIG. 14, the chiplet structure 130 may be mounted on the front side redistribution layer structure 120 by flip chip bonding. The connection members 147 of a bottom surface of the chiplet structure 130 may be bonded to the first bonding pads 125 of the front side redistribution layer structure 120, such that the chiplet structure 130 and the front side redistribution layer structure 120 may be electrically connected. In an embodiment, the connection members 147 may include micro-bumps or solder balls. In an embodiment, the connection member 147 may include at least one of tin, silver, lead, nickel, copper or an alloy thereof.

Figure 15:
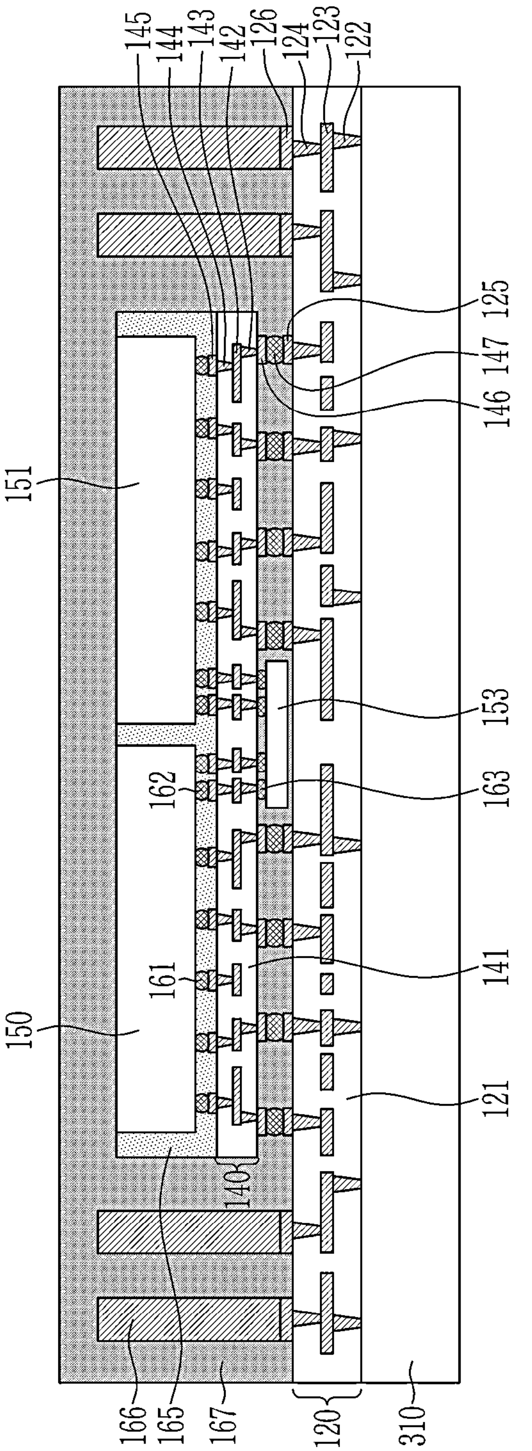

FIG. 15 is a cross-sectional view showing molding of the chiplet structure 130 by the first molding material 167, on the front side redistribution layer structure 120.

Referring to FIG. 15, on the front side redistribution layer structure 120, the chiplet structure 130 may be molded by the first molding material 167. In an embodiment, the molding process by the first molding material 167 may include compression molding or transfer molding process. In an embodiment, the first molding material 167 may include epoxy molding compound (EMC).

Figure 16:
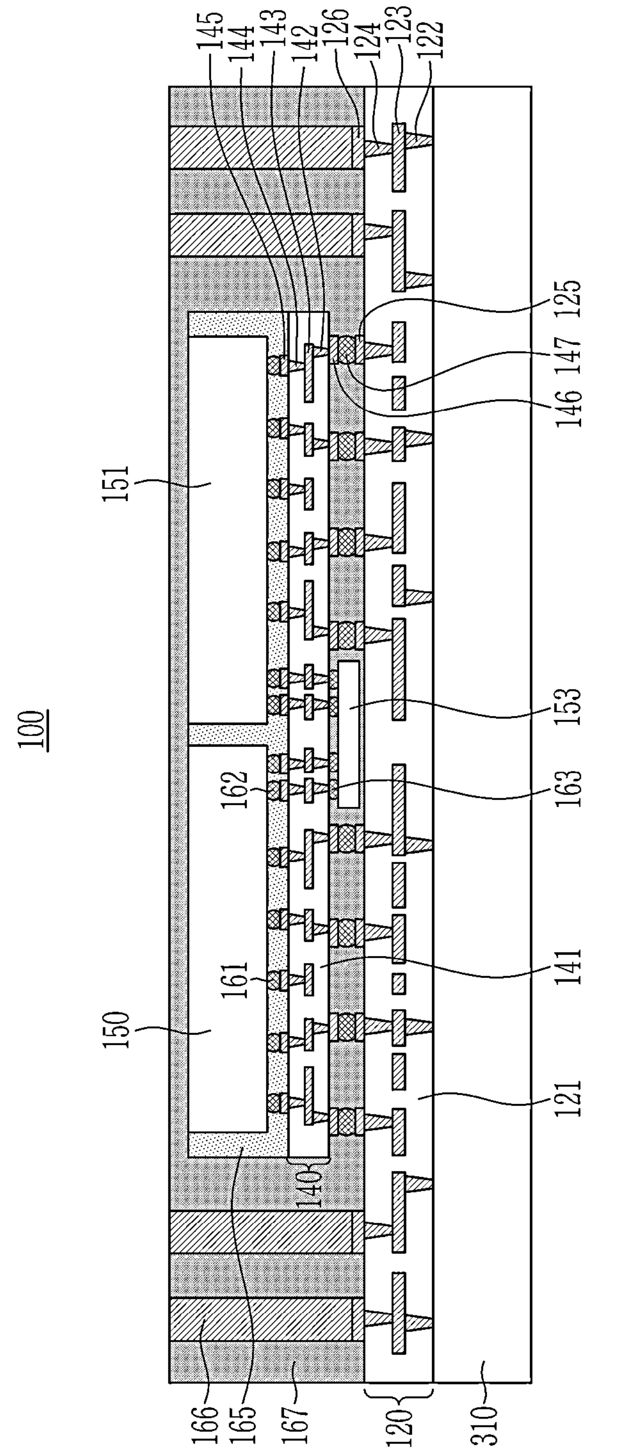

FIG. 16 is a cross-sectional view showing planarizing of the first molding material 167.

Referring to FIG. 16, chemical mechanical polishing (CMP) may be performed in order to level an upper surface of the first molding material 167. An upper surface of the first molding material 167 may be planarized by applying the CMP process. After performing the CMP process, an upper surface of the conductive posts 166 may be exposed.

Figure 17:
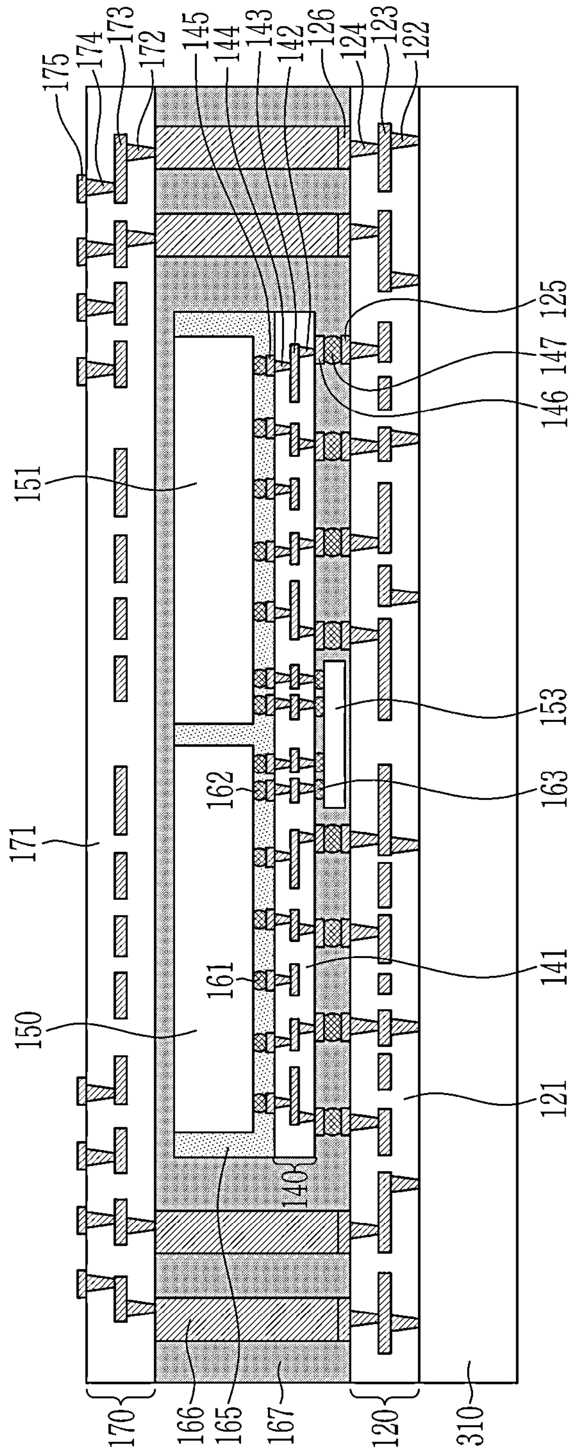

FIG. 17 is a cross-sectional view showing forming of the back-side redistribution layer structure 170 on the conductive posts 166 and the first molding material 167.

Referring to FIG. 17, the back-side redistribution layer structure 170 may be formed on the conductive posts 166 and the first molding material 167.

First, the second dielectric material layer 171 is formed on the conductive posts 166 and the first molding material 167. In an embodiment, the second dielectric material layer 171 may include the photoimageable dielectric (PID) used in a redistribution layer process. In an embodiment, the photoimageable dielectric (PID) may include polyimide-based photoactive polymer, novolac-based photoactive polymer, polybenzoxazole, silicone-based polymer, acrylate-based polymer, or epoxy-based polymer. In an embodiment, the second dielectric material layer 171 is formed of an inorganic dielectric material such as silicon nitride, silicon oxide, and the like. In an embodiment, the second dielectric material layer 171 may be formed by CVD, ALD, or PECVD process.

After forming the second dielectric material layer 171, the second dielectric material layer 171 may be selectively etched to form via holes, and via holes may be filled with a conductive material to form the third redistribution vias 172.

Then, the second dielectric material layer 171 may be additionally deposited on the third redistribution vias 172 and the second dielectric material layer 171, the additionally deposited second dielectric material layer 171 may be selectively etched to form openings, and the openings may be filled with a conductive material to form the second redistribution lines 173.

Then, the second dielectric material layer 171 may be additionally deposited on the second redistribution lines 173 and the second dielectric material layer 171, the additionally deposited second dielectric material layer 171 may be selectively etched to form via holes, and via holes may be filled with a conductive material to form the fourth redistribution vias 174.

Then, photoresist (not shown) may be additionally deposited on the fourth redistribution vias 174 and the second dielectric material layer 171, the photoresist may be selectively exposed and developed to form a photoresist pattern including openings, and the openings may be filled with a conductive material to form the third bonding pads 175.

In an embodiment, the third redistribution vias 172, the second redistribution lines 173, the fourth redistribution vias 174, and the third bonding pads 175 may include at least one of copper, aluminum, tungsten, nickel, gold, tin, titanium and an alloy thereof. In an embodiment, the third redistribution vias 172, the second redistribution lines 173, the fourth redistribution vias 174, and the third bonding pads 175 may be formed by performing a sputtering process. In another embodiment, the third redistribution vias 172, the second redistribution lines 173, the fourth redistribution vias 174, and the third bonding pads 175 may be formed by forming a seed metal layer and then performing an electrolytic plating process.

Figure 18:
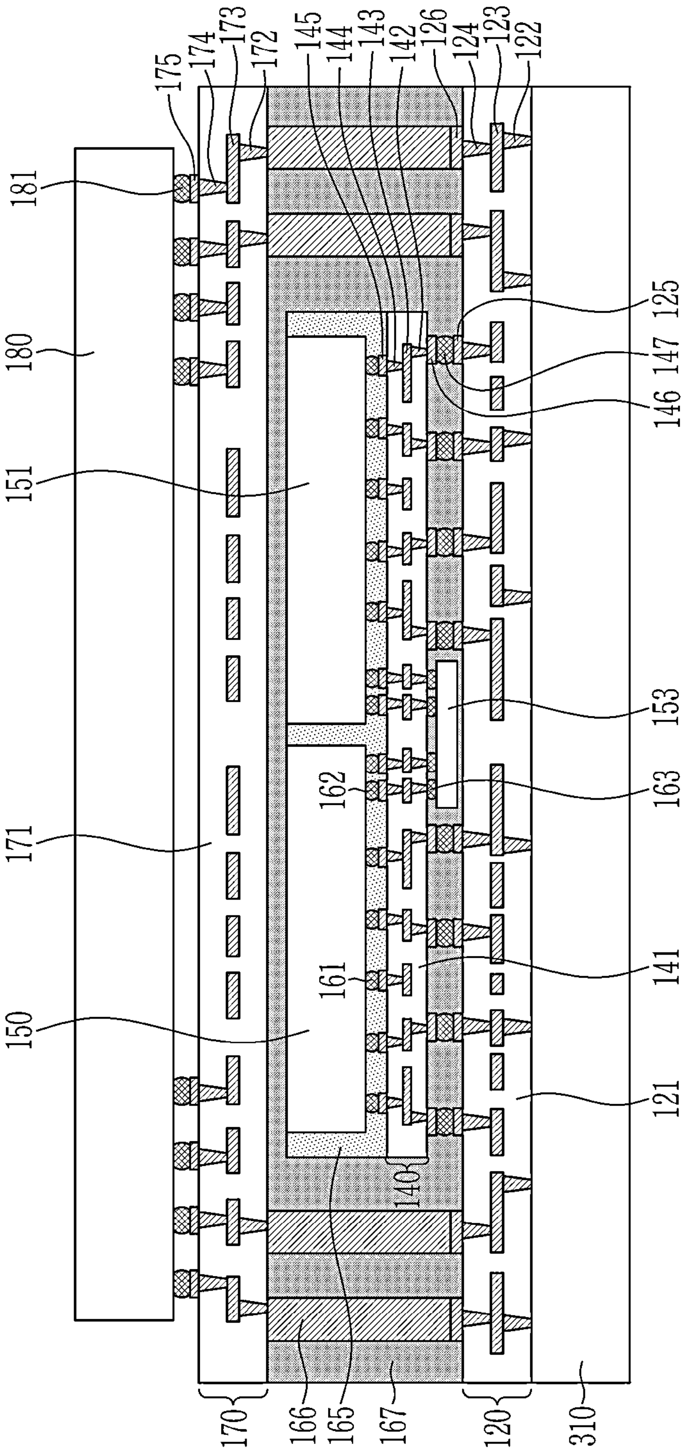

FIG. 18 is a cross-sectional view showing mounting of the memory structure 180 on the back-side redistribution layer structure 170.

Referring to FIG. 18, the memory structure 180 may be mounted on the back-side redistribution layer structure 170 by flip chip bonding. The connection member 181 of the memory structure 180 may be bonded to the third bonding pad 175 of the back-side redistribution layer structure 170, such that the memory structure 180 and the back-side redistribution layer structure 170 may be electrically connected. In an embodiment, the connection member 181 may include micro-bumps or solder balls. In an embodiment, the connection member 181 may include at least one of tin, silver, lead, nickel, copper or an alloy thereof.

Figure 19:
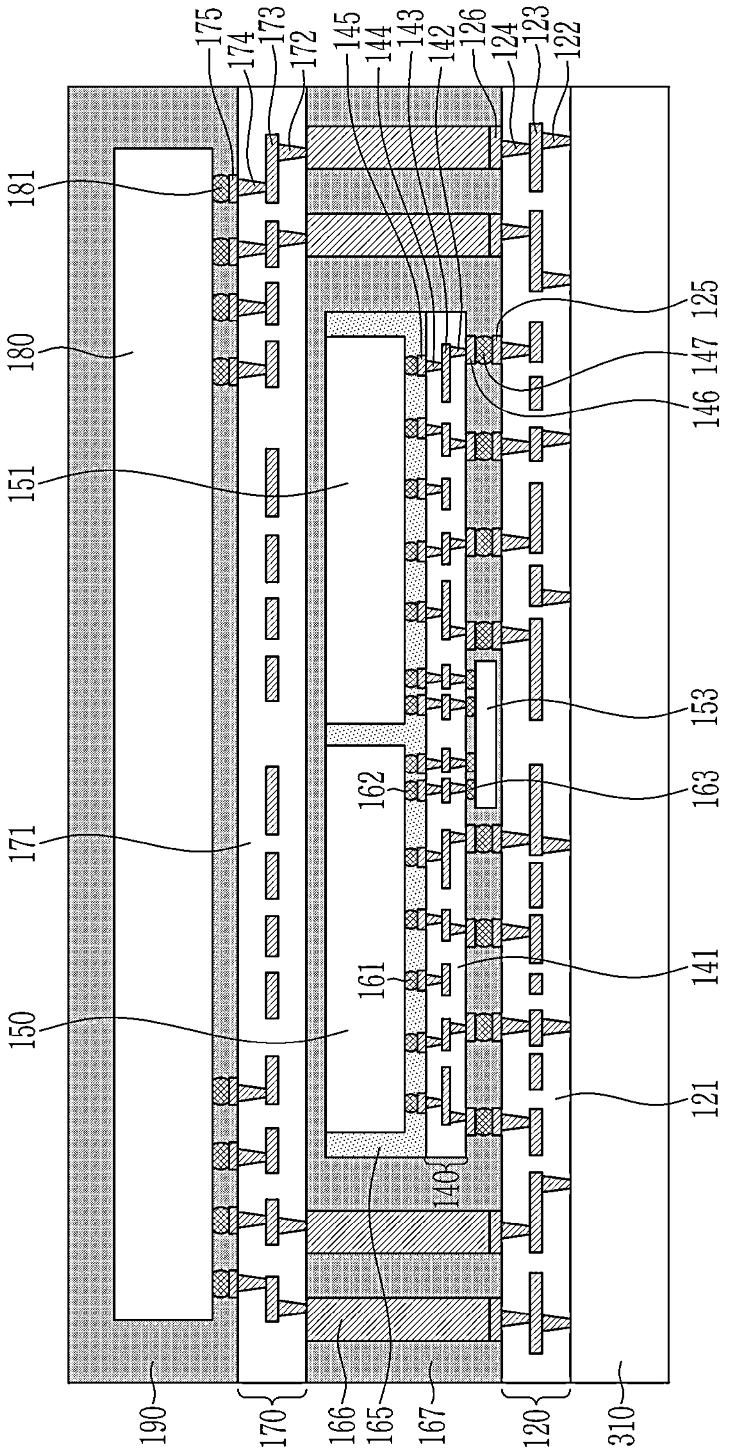

FIG. 19 is a cross-sectional view showing molding of the memory structure 180 by the fourth molding material 190, on the back-side redistribution layer structure 170.

Referring to FIG. 19, on the back-side redistribution layer structure 170, the memory structure 180 may be molded by the fourth molding material 190. In an embodiment, the molding process by the fourth molding material 190 may include compression molding or transfer molding process. In an embodiment, the fourth molding material 190 may include epoxy molding compound (EMC).

Figure 20:
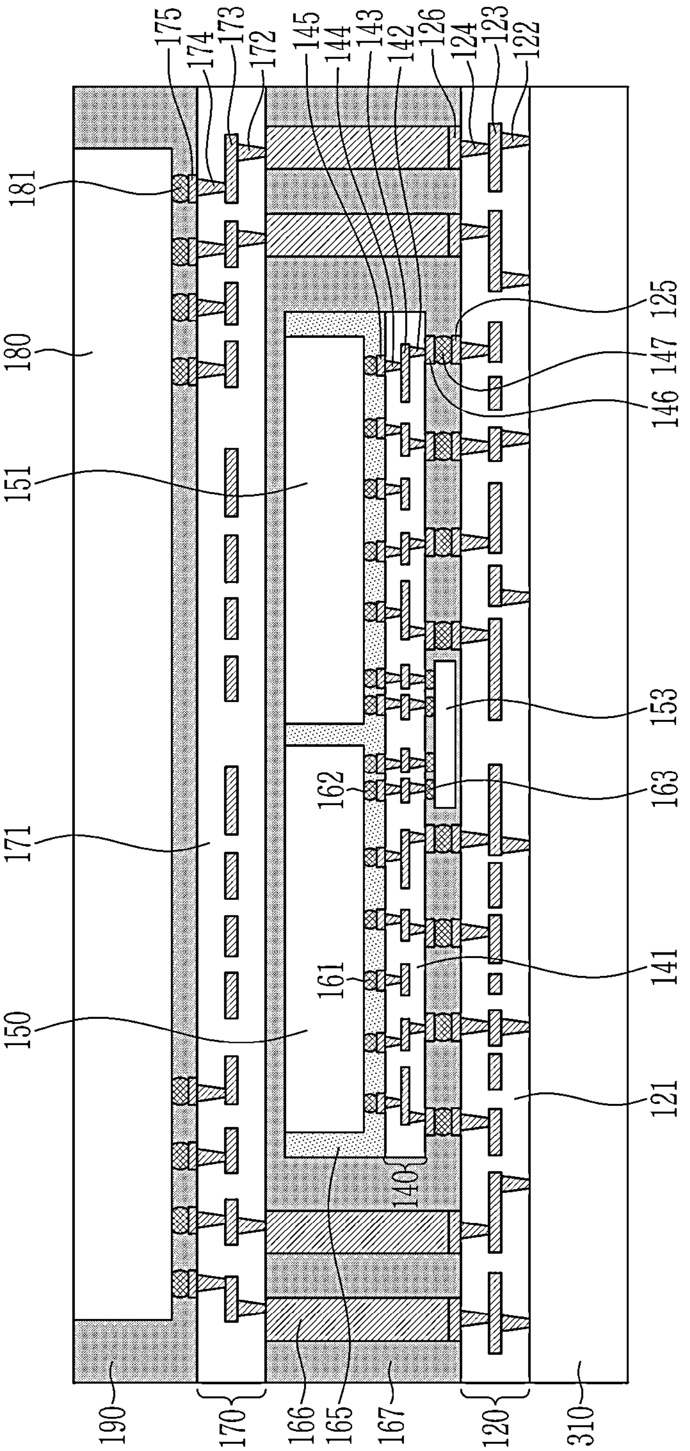

FIG. 20 is a cross-sectional view showing planarizing of the fourth molding material 190.

Referring to FIG. 20, chemical mechanical polishing (CMP) may be performed in order to level an upper surface of the fourth molding material 190. An upper surface of the fourth molding material 190 may be planarized by applying the CMP process. After performing the CMP process, an upper surface of the memory structure 180 may be exposed.

Figure 21:
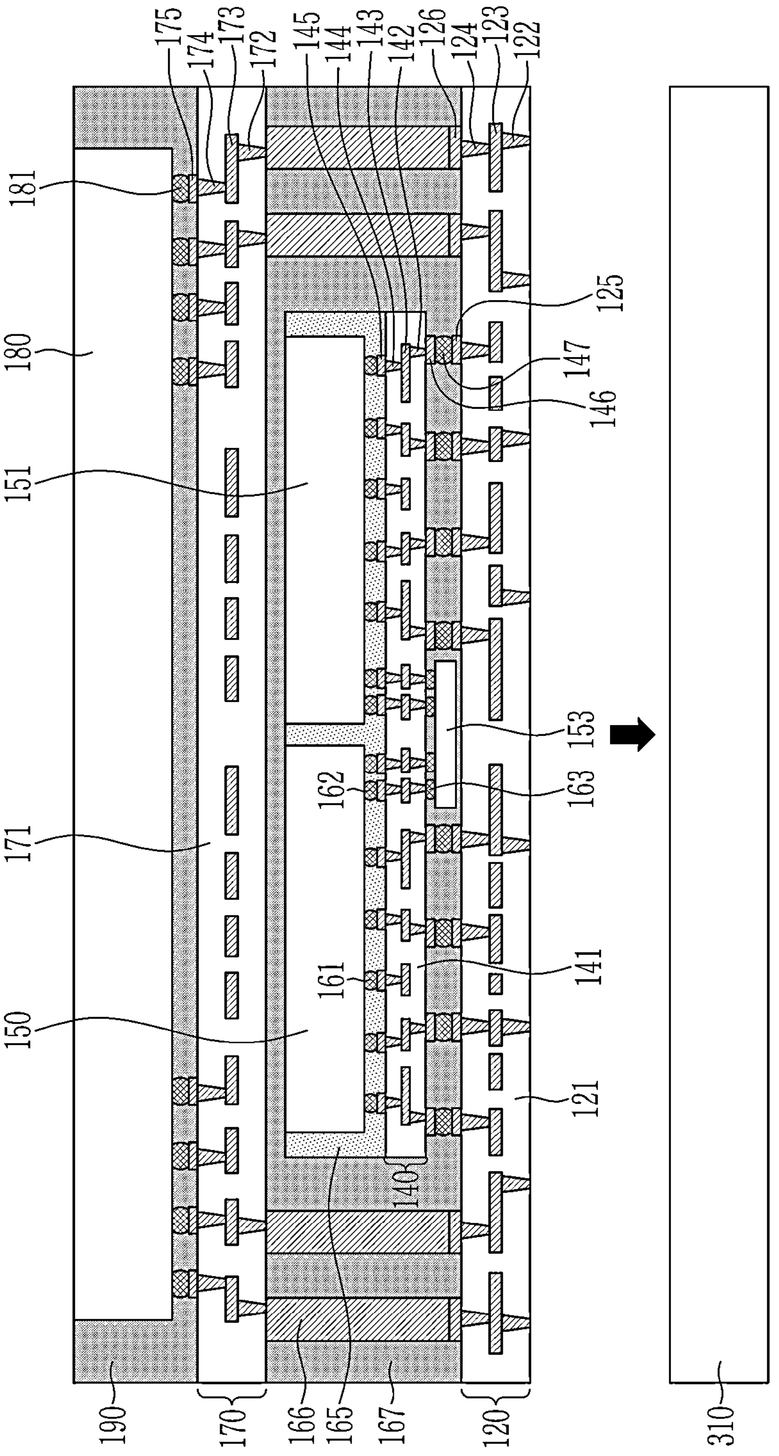

FIG. 21 is a cross-sectional view showing removing of the second carrier 310 from the front side redistribution layer structure 120.

Referring to FIG. 21, the second carrier 310 may be removed from the bottom surface of the front side redistribution layer structure 120.

Figure 22:
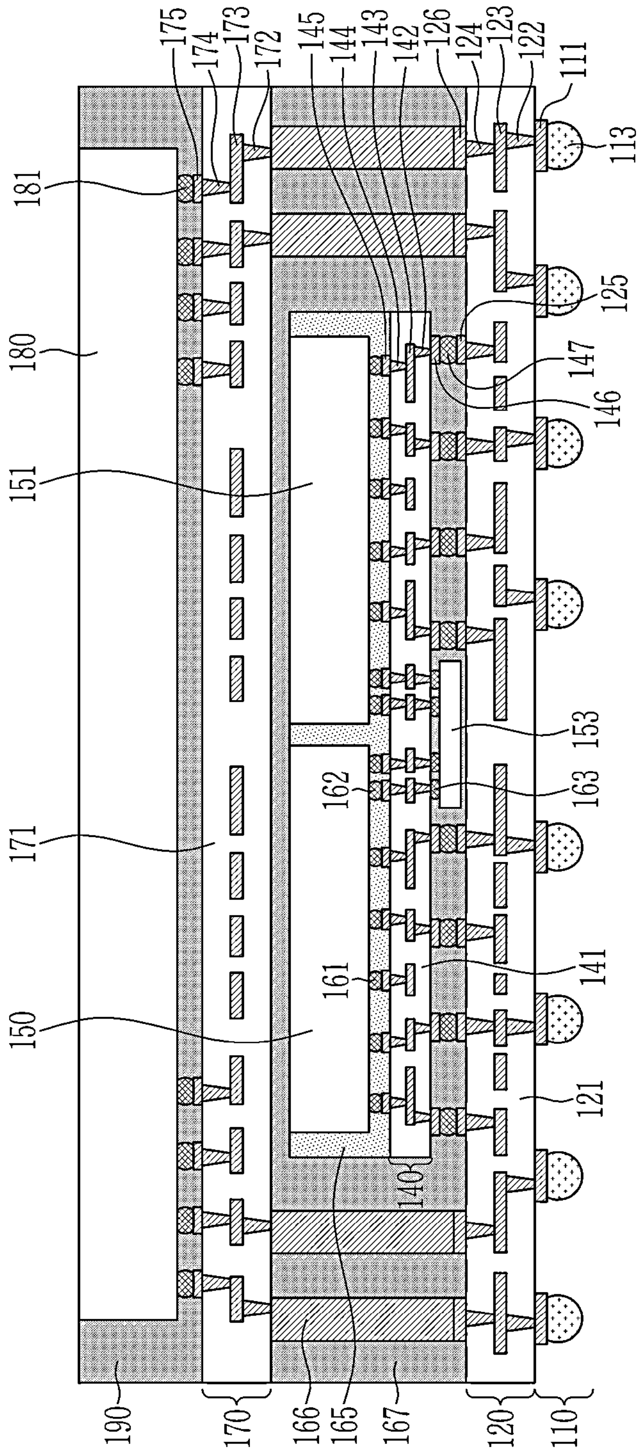

FIG. 22 is a cross-sectional view showing forming of the external connection structure 110 on the bottom surface of the front side redistribution layer structure 120.

Referring to FIG. 22, the external connection structure 110 may be formed on the bottom surface of the front side redistribution layer structure 120. The conductive pads 111 may be formed under the first redistribution vias 122 of the front side redistribution layer structure 120, and the external connection members 113 may be formed under the conductive pads 111. In an embodiment, the conductive pad 111 may include at least one of copper, nickel, zinc, gold, silver, platinum, palladium, chromium, titanium, and an alloy thereof. In an embodiment, the external connection member 113 may include at least one of tin, silver, lead, nickel, copper, or an alloy thereof. In an embodiment, the conductive pad 111 may be formed by performing a sputtering process or an electrolytic plating process after forming a seed metal layer.

One or more of the elements disclosed above may include or be implemented in processing circuitry such as hardware including logic circuits; a hardware/software combination such as a processor executing software; or a combination thereof.

While inventive concepts have been described in connection with the presented embodiments, it is to be understood that embodiments of inventive concepts are not limited to the presented embodiments, but, on the contrary, are intended to cover various modifications and equivalent arrangements included within the spirit and scope of the appended claims.

What is claimed is:

1. A semiconductor package, comprising:

a first redistribution layer structure;

a chiplet structure on the first redistribution layer structure;

a plurality of first connection members on the first redistribution layer structure;

a first molding material on the first redistribution layer structure and molding the chiplet structure and the plurality of first connection members; and a second redistribution layer structure on the first molding material, wherein the chiplet structure includes a third redistribution layer structure, a first chiplet and a second chiplet on the third redistribution layer structure, and a bridge die on a bottom surface of the third redistribution layer structure.

2. The semiconductor package of claim 1, wherein the chiplet structure comprises a plurality of second connection members and a plurality of third connection members, a first group of the plurality of second connection members are between the first chiplet and the third redistribution layer structure, a second group of the plurality of second connection members are between the second chiplet and the third redistribution layer structure, a first group of the plurality of third connection members are between the first chiplet and the third redistribution layer structure, and a second group of the plurality of third connection members are between the second chiplet and the third redistribution layer structure.

3. The semiconductor package of claim 2, wherein the first chiplet and the second chiplet respectively are configured to exchange a signal through the bridge die and the plurality of third connection members.

4. The semiconductor package of claim 2, wherein an interval in a horizontal direction of neighboring second connection members among the plurality of second connection members is larger than an interval in the horizontal direction of neighboring third connection members among the plurality of third connection members.

5. The semiconductor package of claim 2, wherein the plurality of second connection members and the plurality of third connection members are micro-bumps.

6. The semiconductor package of claim 1, wherein the plurality of first connection members are next to a side surface of the chiplet structure.

7. The semiconductor package of claim 1, wherein the plurality of first connection members are conductive posts.

8. The semiconductor package of claim 1, wherein the plurality of first connection members electrically connect the second redistribution layer structure to the first redistribution layer structure.

9. The semiconductor package of claim 1, wherein a thickness of the bridge die in a vertical direction is smaller than a thickness of the first chiplet in the vertical direction and a thickness of the second chiplet in the vertical direction.

10. The semiconductor package of claim 1, wherein the chiplet structure further comprises a second molding material on the third redistribution layer structure and molding the first chiplet and the second chiplet.

11. The semiconductor package of claim 10, wherein a material of the second molding material is different from a material of the first molding material.

12. The semiconductor package of claim 1, further comprising:

a memory structure on the second redistribution layer structure.

13. The semiconductor package of claim 1, wherein the first chiplet comprises at least one of a central processing unit (CPU) and a graphic processing unit (GPU).

14. The semiconductor package of claim 1, wherein the second chiplet comprises an SRAM.

15. A semiconductor package, comprising:

a first redistribution layer structure;

a first chiplet structure on the first redistribution layer structure;

a plurality of connection members on the first redistribution layer structure;

a first molding material on the first redistribution layer structure and molding the first chiplet structure and the plurality of connection members;

a second redistribution layer structure on the first molding material; and a second chiplet structure on the second redistribution layer structure, wherein the first chiplet structure includes a third redistribution layer structure, a first chiplet and a second chiplet on the third redistribution layer structure, and a first bridge die on a bottom surface of the third redistribution layer structure, the second chiplet structure includes a fourth redistribution layer structure, a third chiplet and a fourth chiplet on the fourth redistribution layer structure, and a second bridge die on a bottom surface of the fourth redistribution layer structure.

16. The semiconductor package of claim 15, wherein:

the first chiplet structure further comprises a second molding material on the third redistribution layer structure and molding the first chiplet and the second chiplet, and the second chiplet structure further comprises a third molding material on the fourth redistribution layer structure and molding the third chiplet and the fourth chiplet.

17. The semiconductor package of claim 15, further comprising:

a fourth molding material on the second redistribution layer structure and molding the second chiplet structure.

18. The semiconductor package of claim 15, wherein the third chiplet comprises at least one of a power management unit, a clock unit, a communication unit, and a sensor.

19. The semiconductor package of claim 15, wherein the fourth chiplet comprises a DRAM.

20. A method for manufacturing a semiconductor package, comprising:

forming a first redistribution layer structure on a first carrier;

forming a plurality of connection members on the first redistribution layer structure;

mounting a chiplet structure on the first redistribution layer structure;

molding the plurality of connection members and the chiplet structure using a first molding material on the first redistribution layer structure; and forming a second redistribution layer structure on the first molding material, wherein the chiplet structure includes a third redistribution layer structure, a first chiplet and a second chiplet on the third redistribution layer structure, and a bridge die on a bottom surface of the third redistribution layer structure.

* * * * *